(12) United States Patent
Yang et al.

(10) Patent No.: US 10,957,657 B2
(45) Date of Patent: *Mar. 23, 2021

(54) ADVANCED CRACK STOP STRUCTURE

(71) Applicant: International Business Machines Corporation, Armonk, NY (US)

(72) Inventors: Chih-Chao Yang, Glenmont, NY (US); Baozhen Li, South Burlington, VT (US); Xiao Hu Liu, Briarcliff Manor, NY (US); Griselda Bonilla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/656,505

(22) Filed: Oct. 17, 2019

(65) Prior Publication Data

US 2020/0051930 A1 Feb. 13, 2020

Related U.S. Application Data

(63) Continuation of application No. 15/938,207, filed on Mar. 28, 2018, now Pat. No. 10,490,513.

(51) Int. Cl.
*H01L 23/00* (2006.01)
*H01L 23/522* (2006.01)
(Continued)

(52) U.S. Cl.
CPC ...... *H01L 23/562* (2013.01); *H01L 21/76843* (2013.01); *H01L 21/76877* (2013.01); *H01L 23/528* (2013.01); *H01L 23/5226* (2013.01)

(58) Field of Classification Search
CPC . H01L 23/562; H01L 23/5226; H01L 23/528; H01L 23/585; H01L 21/76877; H01L 21/76843; H01L 21/76831
(Continued)

(56) References Cited

U.S. PATENT DOCUMENTS 6,677,680 B2 1/2004 Gates
7,456,098 B2 11/2008 Hichri
(Continued)

OTHER PUBLICATIONS

"Chip Corner and Edge Reinforcement Structures to Prevent Low-k Chip Cracking", IPCOM000109770D, Mar. 24, 2005.
(Continued)

*Primary Examiner* — Dao H Nguyen
(74) *Attorney, Agent, or Firm* — Jeffrey S LaBaw; Steven J Meyers

(57) ABSTRACT

A method for constructing an advanced crack stop structure is described. An interconnection structure is formed comprised of a plurality of levels. Each level has an interconnect structure section and a crack stop section. In a first level of the interconnection structure, a high modulus layer is formed in the crack stop recess but not the interconnect recess and a barrier layer and a conductive metal layer is formed in both the interconnection recess and the crack stop recess of the first level. In a second level of the interconnection structure and the crack stop structure, a second high modulus layer is formed in the crack stop recess but not the interconnect recess and a barrier layer and a conductive metal layer is formed in both the interconnection recess and the crack stop recess of the second level. The barrier layers and high modulus layers are deposited in different steps.

20 Claims, 13 Drawing Sheets

(51) Int. Cl.
*H01L 21/768* (2006.01)
*H01L 23/528* (2006.01)
*H01L 23/58* (2006.01)

(58) Field of Classification Search
USPC ....... 257/571, 532, 620, 751, 758, 773, 774,
257/E21.011, E21.251, E21.295, E21.309,
257/E21.495, E21.599; 438/462, 465,
438/622, 623, 627
See application file for complete search history.

(56) References Cited

U.S. PATENT DOCUMENTS

| | | | | |
|---|---|---|---|---|
| 7,521,336 B2 * | 4/2009 | Daubenspeck | ... | H01L 21/31111 438/462 |
| 7,622,364 B2 * | 11/2009 | Adkisson | ............. | H01L 23/562 438/462 |
| 8,004,066 B2 | 8/2011 | Kim | | |
| 8,048,761 B2 | 11/2011 | Yeo | | |
| 8,089,162 B2 | 1/2012 | Watanabe | | |
| 8,188,574 B2 | 5/2012 | Angyal | | |
| 8,309,435 B2 | 11/2012 | Kaltalioglu | | |
| 8,790,975 B2 * | 7/2014 | Baars | ................. | H01L 23/5223 257/E21.646 |
| 9,589,911 B1 | 3/2017 | Liang | | |
| 9,824,981 B2 | 11/2017 | Yamada | | |
| 10,475,753 B2 | 11/2019 | Yang | | |
| 10,490,513 B2 * | 11/2019 | Yang | ................. | H01L 21/76877 |
| 2004/0087078 A1 | 5/2004 | Agarwala | | |
| 2005/0026397 A1 | 2/2005 | Daubenspeck | | |
| 2008/0093746 A1 * | 4/2008 | Lee | ................... | H01L 23/53238 257/776 |
| 2009/0051011 A1 * | 2/2009 | Usami | ................... | H01L 23/585 257/620 |
| 2009/0146260 A1 | 6/2009 | Eto | | |
| 2010/0123219 A1 | 5/2010 | Chen | | |
| 2015/0137388 A1 * | 5/2015 | Kim | ...................... | H01L 23/562 257/774 |
| 2015/0171025 A1 | 6/2015 | Shao | | |
| 2016/0027726 A1 | 1/2016 | Zhu | | |
| 2020/0035620 A1 | 1/2020 | Yang | | |
| 2020/0035621 A1 * | 1/2020 | Yang | ................. | H01L 21/76877 |

OTHER PUBLICATIONS

Novel BLM Final Via Structure for C4 Crackstop, Crack Sensor, and Wiring,IPCOM000183894D Jun. 4, 2009.
IBM Patents or Patent Applications Treated As Related.

* cited by examiner

ADVANCED CRACK STOP STRUCTURE

BACKGROUND OF THE INVENTION

This disclosure relates to integrated circuit devices, and more specifically, to a method and structure to create crack stop structures in semiconductor devices.

When a semiconductor wafer is diced into individual integrated circuit chips, cracks can form in the dicing region of the wafer. To prevent the crack from propagating from the dicing region into the active region of the chip, "crack stopper" or "crack stop" structures have been adopted by the industry to withstand the stresses resulting from the chip dicing operation during manufacturing. In the prior art, a crack stop structure comprised of a metal stack is built in a peripheral region surrounding active chip area, that is, the metal and dielectric interconnect levels which electrically connect the devices built deeper in the substrate.

With the adoption of low-k dielectrics, the effectiveness of the crack stop structures in stopping cracking proliferation has been reduced due to the brittleness of the low-k dielectrics as compared with the conventional dielectric materials. In addition to the problems caused by the low-k dielectrics, the stress level during the dicing operation is increasing in advanced chip designs due to a variety of factors such as increased chip size, organic laminate design, and the introduction of lead free solder metallurgies.

Thus, producing improved crack stop structures that can resist cracks driven by dicing induced stresses has become a critical issue for the industry. The present disclosure presents an advanced crack stop structure to alleviate this problem.

BRIEF SUMMARY

According to this disclosure, a method for constructing an advanced crack stop structure is described. An interconnection structure is formed comprised of a plurality of levels. Each level has an interconnect structure section and a crack stop section. In a first level of the interconnection structure, a high modulus layer is formed in the crack stop recess but not the interconnect recess and a barrier layer and a conductive metal layer is formed in both the interconnection recess and the crack stop recess of the first level. In a second level of the interconnection structure and the crack stop structure, a second high modulus layer is formed in the crack stop recess but not the interconnect recess and a barrier layer and a conductive metal layer is formed in both the interconnection recess and the crack stop recess of the second level. The barrier layers and high modulus layers are deposited in different steps.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
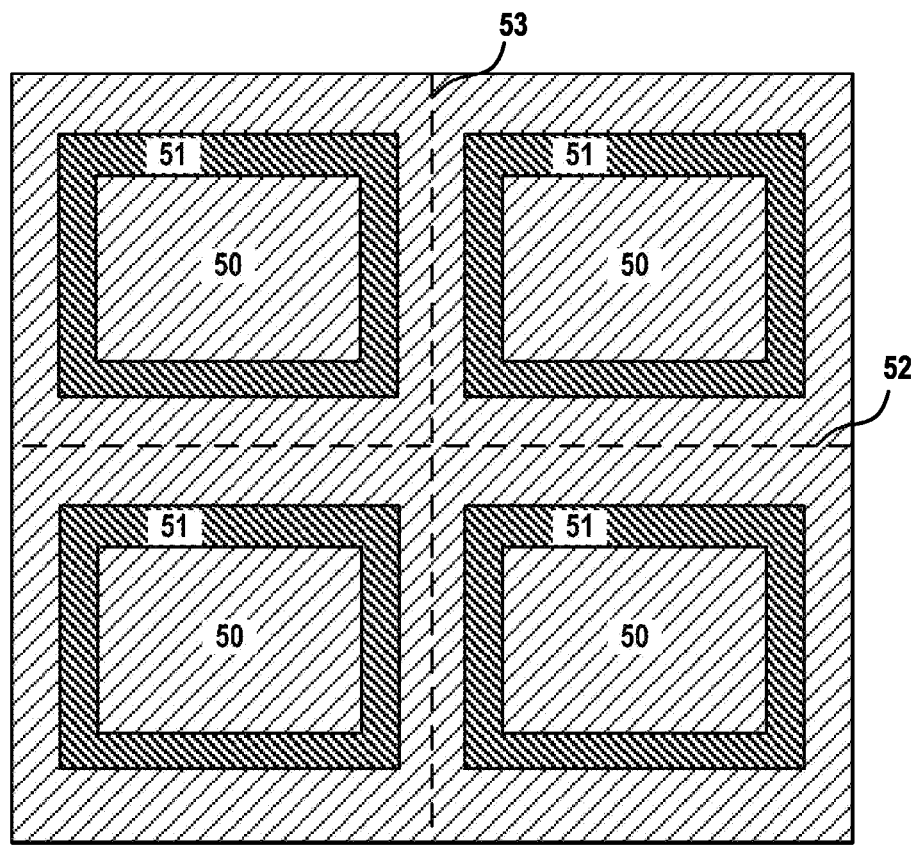
FIG. 1 is a top view diagram depicting a chip substrate having four chips each equipped with a crack stop structure.

At a high level, embodiments of the invention provide an advanced crack stop structure in which a high modulus material is used to prevent propagation of cracks formed during the dicing of the semiconductor wafer. Embodiments of the invention use some process steps used in the formation of the interconnecting metallurgy of the active area of the integrated circuit in the formation of the crack stop structure.

A "high modulus" or "higher modulus" material as used herein is defined with reference to the "modulus" or strength of the dielectric layer in which the "high modulus" material in which it is embedded. The properties of a "high modulus" are according to Young's modulus which is well defined in the art. That is, a high modulus material does not change its shape appreciably under load. This is in contrast to the brittle low-k dielectric used in layers of the interconnect and crack stop structures, e.g., porous SiO2 tends to be brittle and deforms irretrievably, i.e. cracks, under the load, for example, the load induced by the dicing operation. For the purposes of the invention, a high or higher modulus material is stronger under stress than the dielectric in which it is embedded.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. As discussed in the specification, the dielectrics are considered high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). Dielectrics with low dielectric constants, e.g., SiO2, have relative dielectric constants of 3.8 or below. Representative low-k dielectrics have dielectric constants equal or lower than 3.5. Example of low-k dielectrics include porous SiO2, and carbon doped SiO2. The dielectric can be a combination of two or more of these materials. The thickness of dielectrics herein may vary contingent upon the required device performance.

The conductors mentioned herein can be formed of a conductive material such as one or more metals, such as copper, aluminum, tungsten, hafnium, tantalum, molybdenum, titanium, or nickel, or a metal silicide, any alloys of such metals, and may be deposited using physical vapor deposition, chemical vapor deposition, or any other technique known in the art.

"Electrically conductive" and/or "electrical conductor" as used through the present disclosure means a material typically having a room temperature resistivity less than about 400 μΩ-cm. As used herein, the terms "insulator" and "dielectric" denote a material having a room temperature resistivity greater than about 400 μΩ-cm.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., using plasma etching) to remove the unprotected portions of the material to be patterned. The resist is subsequently removed to leave the underlying material patterned according to the light exposure pattern.

Embodiments will be explained below with reference to the accompanying drawings.

FIG. 1 is a top view diagram depicting a chip substrate having four chips, each equipped with a crack stop structure. Although one skilled in the art will appreciate that many more chips are typically formed in a given semiconductor wafer, four chips are shown for ease in illustration. Active areas 50 of the chips are surrounded by crack stop structures 51. The crack stop structures 51 are intended to stop cracks from propagating when the wafer is diced along dice lines 52.

Figure 2:
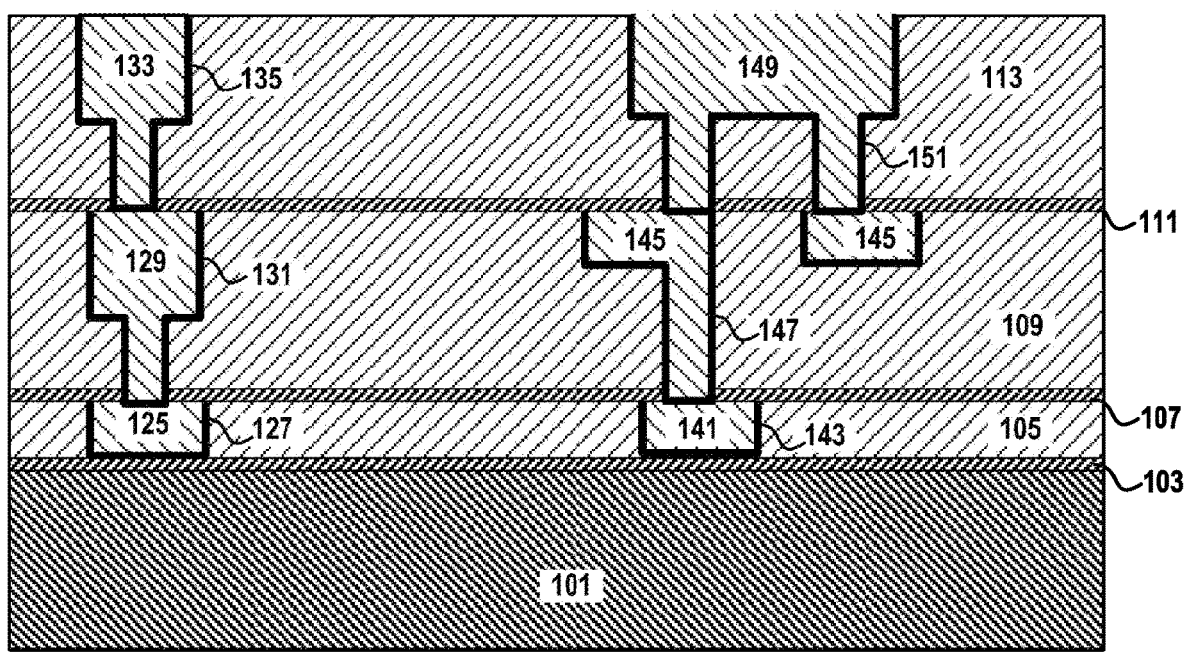
FIG. 2 is a cross-sectional diagram depicting a prior art crack stop structure together with a simplified metal interconnect structure.

FIG. 2 is a cross-sectional diagram depicting a prior art metal stack crack stop structure (to the left) together with a simplified metal interconnect structure (to the right) on a substrate 101. Although only a pair of structures is shown for ease in illustration, the patterned interconnection structure is usually more complicated and includes a large plurality of vias and a plurality of metal lines at each level of the interconnection. Similar to the interconnection structure, the crack stop structure is comprised of a plurality of vias and metal lines.

As shown in the drawing, the crack stop structure and interconnect metallurgy structure are disposed adjacent to each other on the substrate 101. The interconnect structure is used to electrically interconnect a plurality of semiconductor devices. For ease in illustration, the embedded devices are not shown, but could include nFETs, pFETs and isolation dielectrics built in a semiconductor substrate. A set of capping/etch stop layers 103, 107, 111 separate a set of inter-layer dielectric (ILD) layers 105, 109, 113. The capping etch stop layers are made of silicon nitride (Si3N4) or silicon carbide (SiC) and the ILD layers are composed of a dielectric. The prior art metal stack crack stop structure is comprised of a set of metal lines and/or vias 125, 129, 133 and a set of liner layers 127, 131, 135. The metal layers 125, 129, 133 are typically copper or a copper alloy, but can be formed from a variety of metals. The liner layers 127, 131, 135 are typically a barrier layer such as titanium or tantalum or their nitrides. For ease in construction, the crack stop structure is built from a similar set of materials as the interconnecting metallurgy. As shown, the metal layers 141, 145, 149 and barrier layers 143, 147, 151 which form the interconnect are the same materials as the metal layers 125, 129, 133 and barrier layers 127, 131, 135 which form the crack stop structure.

As shown in FIG. 1, the metal stack crack stop structures shown in FIGS. 2-13 surround the metallurgy which is part of the active circuit area. The problem with the prior art structure is that when a low-k dielectric such as porous SiO2 is used, which is brittle as compared to the dense dielectric materials, the crack stop structure is ineffective and cracks propagate into the active device area. The dense dielectrics have a higher modulus than a brittle low-k dielectric, that is, they do not deform under the load created by the dicing operation.

Figure 3:
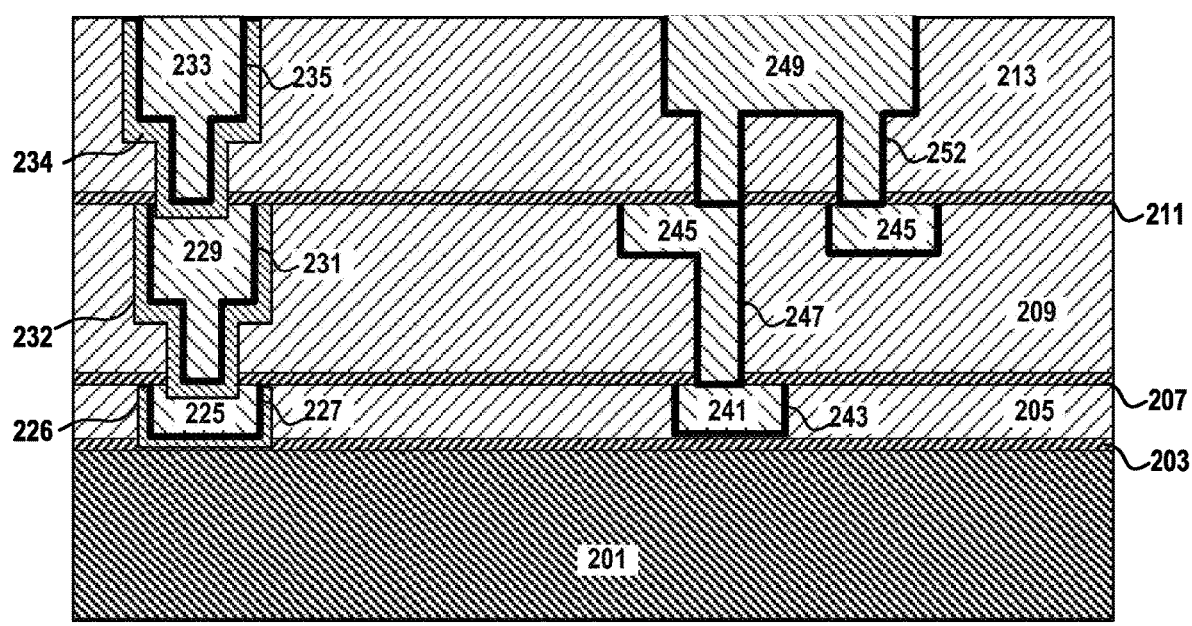
FIG. 3 is a cross-sectional diagram depicting a crack stop structure together with a simplified metal interconnect structure according to a first embodiment of the invention.

FIG. 3 is a cross-sectional diagram depicting a crack stop structure (on the left) together with a simplified metal interconnect structure (on the right) according to a first embodiment of the invention. The invention introduces a set of high modulus liners 226, 232, 234 within the crack stop structure which is not present in the interconnect metallurgy for the active chip area. As shown in the drawing, in this embodiment, the metal stack crack stop structure is further comprised of a set of metal layers 225, 229, 233 and a set of liner layers 227, 231, 235. The metal layers 241, 245, 249 and barrier layers 243, 247, 251 which form the interconnect are the same materials as the metal layers 225, 229, 233 and barrier layers 227, 231, 235 which form the crack stop structure at the same level in preferred embodiments of the invention. However, the interconnect structure lacks the high modulus liners. The substrate 201, capping layers 203, 207, 211 and inter-layer dielectric (ILD) layers 205, 209, 213 complete the structure.

In embodiments of the invention, the high modulus liner could be an insulating material such as SiC, Si3N4 or SiO2. In other embodiments, the high modulus layer can be a metal or a metallic layer. For the embodiments where the high modulus liner is a metallic material, some of the materials which can be used are W, Ta, Ti, Ru, Rh, Co and/or their nitrides, oxides and alloys. Where the high modulus liner is a metal, in preferred embodiments, the high modulus liner is much thicker than the barrier layers in the crack stop structure or interconnect structure.

In embodiments of the invention, the high modulus liner is a single material layer. In other embodiments, the high modulus liner contains multiple material layers. Depending on the technology used for the metallurgy and other factors, the high modulus liner has a thickness range between 5 Angstroms and 100 nm. In embodiments of the invention in which a metallic high modulus layer is used, it is 50% (or more) thicker than the regular barrier liner total thickness in the device area, e.g., layer 252 in FIG. 3.

The invention finds particular application, as compared to the prior art process, where an advanced technology requires a minimal metal barrier/liner for a resistance-capacitance (RC) requirement for the interconnection metallurgy.

Ideally, the high modulus liner material is chosen for a high adhesion property with the ILD layer, the capping layer and the metal layer. For example, nitride materials generally have better adhesion properties as compared to the pure metal, TaN vs. Ta. As the electrical connectivity either in-plane or out-of-plane is irrelevant for the crack stop structure, by the inclusion of an additional high modulus layer, the inventors realized the opportunity to improve the crack stop structure toughness by using the appropriate dielectric or metal material is available for the inventive structure if a new layer is introduced in the crack stop structure.

Although only three levels of the crack stop structure and metallurgy structure are shown for ease in illustration, in an actual device, there may be more or fewer levels. In the invention, the number of levels of the crack stop structure and the metallurgy structure are equal. By having an equal number of levels, many of the process steps can be shared between forming the crack stop and interconnections. Also, the high modulus layer and its thickness in a respective level can be selected according to the interconnect structure in the level, e.g., what dielectric is used in the level.

In embodiments of the invention, the structure of the crack stop structure parallels that of the interconnect structure. That is, where there is a metal line in the interconnect, a metal line is present in the crack stop, where there is a via in the interconnect, there is a via in the crack stop structure.

A process for creating the crack stop structure and interconnection is described below with reference to FIGS. 4-7.

Figure 4:
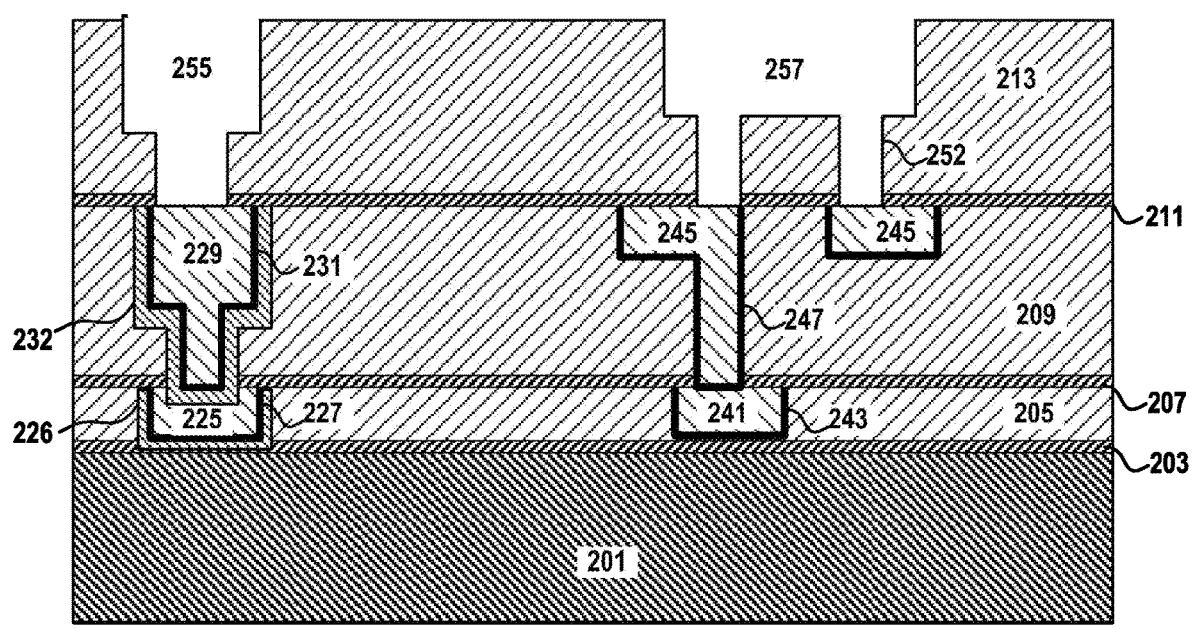
FIG. 4 is a cross-sectional diagram depicting a crack stop structure together with a simplified metal interconnect structure after an etch step has been performed on a top insulator layer according to a first embodiment of the invention.

FIG. 4 is a cross-sectional diagram depicting a crack stop structure together with a simplified metal interconnect structure after a patterning etch step has been performed on a top insulator layer according to a first embodiment of the invention. In the following description, only the processes used for fabricating the final level of the crack stop and metallurgy structures are described. In preferred embodiments of the invention, the process for the first and second levels are very similar.

At this point in the process, the first and second levels of the crack stop structure and the interconnection metallurgy structure are already fabricated. First and second capping layers 203, 207 separate the first and second dielectric layers 205, 209. The first layer of the crack stop structure is comprised of first level metal 225, high modulus layer 226 and barrier layer 227; the second layer of the crack stop structure is comprised of second level metal 229, high modulus layer 232 and barrier layer 231. The first level of the interconnection structure is comprised of first level metal 241 and barrier layer 243 and the second level of the interconnection is comprised of the second level metal 245 and the barrier layer 247. In preferred embodiments, the metal and barrier materials, when used, are the same on a given level as compared between the crack stop and metallurgy on that level. As will be discussed later, in some embodiments of the invention, the metal and barrier material may not be used in a given level of the crack stop. The metal and barrier materials can be the same throughout different levels of the structures or different between levels. Typically, the levels have respective total thicknesses from 50 nm to 800 nm with a total thickness from 80 nm to 500 nm being more preferred, but this is largely dependent on the interconnection technology used.

In preferred embodiments, the dielectric material 213 is made of a low-K dielectric such as porous SiO2 and porous Si (C, O, H) and is disposed on capping layer 211. In some embodiments, the dielectric material 213 may be composed of a single dielectric material. In other embodiments, the dielectric material 213 may be composed of at least two different dielectric materials. As is known, to form such a pattern in a dielectric, a photoresist or sacrificial mandrel layer is first patterned over a dielectric layer. A subsequent etch, e.g., a reactive ion etch (RIE) process, creates the dielectric structure depicted in FIG. 4, leaving recess 255 for the crack stop feature and recess 257 for the metallurgy. As depicted, a dual damascene process is used wherein a metal line and via are formed in a single deposition; the larger cross-section areas above are the metal lines and the smaller cross section areas below are the vias.

Figure 5:
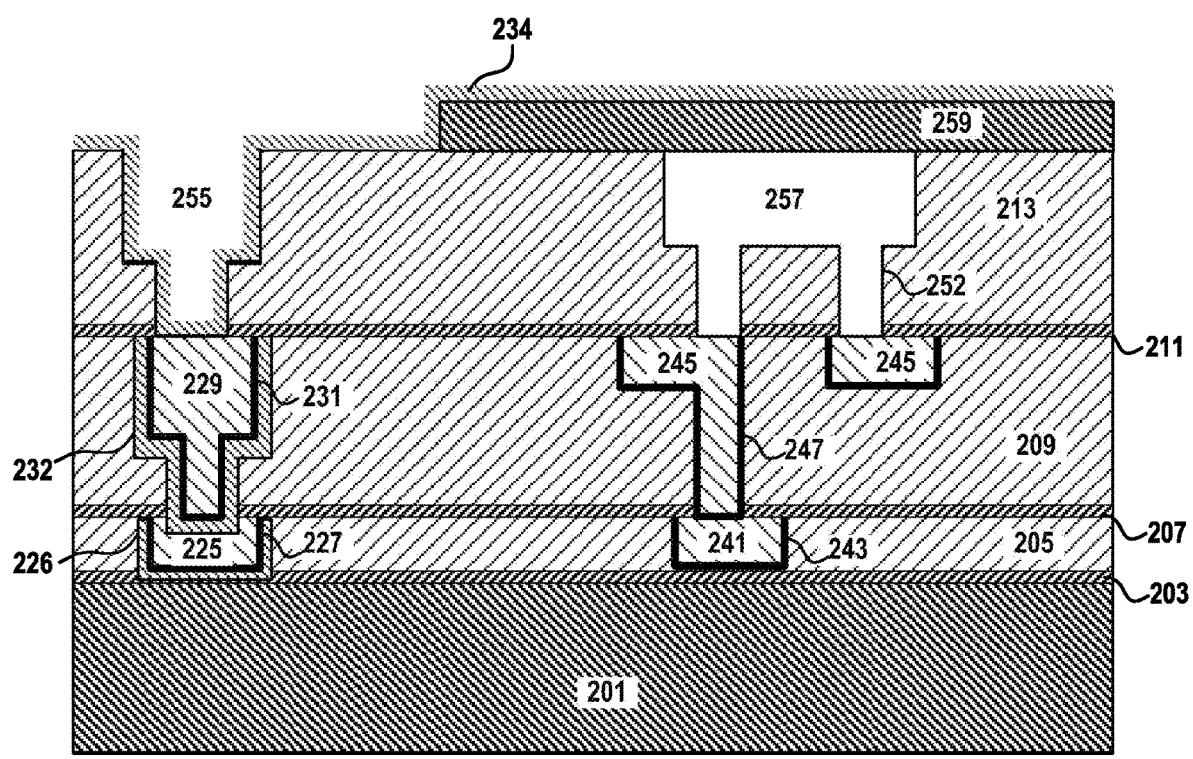
FIG. 5 is a cross-sectional diagram depicting the crack stop structure together with a simplified metal interconnect structure after block out mask deposition and high modulus material deposition steps have been performed according to a first embodiment of the invention.

FIG. 5 is a cross-sectional diagram depicting the crack stop structure together with a simplified metal interconnect structure after a block out mask deposition step and a high modulus material deposition step have been performed according to a first embodiment of the invention. The block out mask 259 is preferably comprised of a photoresist material in preferred embodiments of the invention. In other embodiments, the block out mask 259 is a hard mask comprised of a silicon containing material which is more robust than photoresist. Other hard mask materials such as silicon nitride or titanium nitride can be used. These materials and the deposition processes used to fabricate them are well known in the art. The block out mask 259 is patterned so that the interconnecting metallurgy structure is protected while the crack stop structure is exposed. Next, a high modulus layer 234 is deposited in the crack stop recess.

In preferred embodiments of the invention, the process of creating the crack stop structure is "compatible" with the process for creating the interconnect structure. That is, the process steps and materials are shared as much as possible, consistent with the goal of creating a more robust crack stop structure. For example, in embodiments of the invention, it is preferred that the high modulus layer is deposited before the barrier layer, as having a single block out mask rather than two block out masks is more efficient. For example, if the high modulus layer was deposited after the barrier layer, two block out masks would be needed. As mentioned elsewhere, in some embodiments, high modulus layer is deposited in the entirety of the recess. However, where the high modulus layer only fills a portion of the recess, some of the recess is filled with the barrier layer and/or metal used in the interconnect structure.

In some embodiments of the invention, a single high modulus layer 234 is deposited. For example, a layer of insulating material such as SiC, Si3N4, or SiO2 can be deposited using known (or developed in the future) processes. Depending on the material, different deposition technologies are used in respective embodiments. For example, a SiC or Si3N4 layer is deposited using a chemical vapor deposition (CVD) process such as a low pressure chemical vapor deposition (LPCVD) or a plasma enhanced chemical vapor deposition (PECVD) process in embodiments of the invention. Where a single layer of high modulus material is deposited, the layer 234 has a thickness from 1 nm to 400 nm with a thickness from 3 nm to 100 nm being more preferred. The deposition of the high modulus layer is a conformal deposition in some embodiments of the invention, but not required. Other types of deposition processes which can be used to deposit the high modulus layer include physical vapor deposition (PVD) and atomic layer deposition (ALD).

Figure 6:
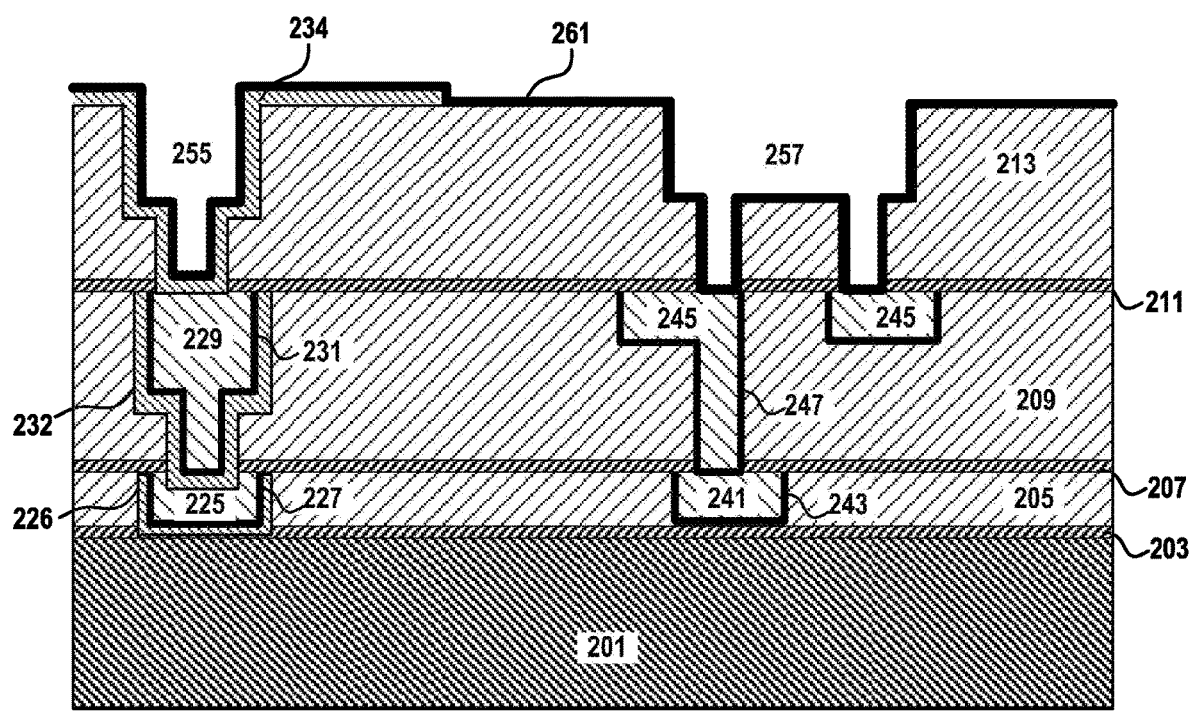
FIG. 6 is a cross-sectional diagram depicting the crack stop structure together with a simplified metal interconnect structure after a barrier layer has been formed according to a first embodiment of the invention.

FIG. 6 is a cross-sectional diagram depicting the crack stop structure together with a simplified metal interconnect structure after a barrier layer has been formed according to a first embodiment of the invention. In this diagram, the block out mask has been removed. The technology used to remove the mask will depend on the material used for the block mask and that used for the high modulus layer. The removal of the block out mask can be accomplished by any one or more of the various material removal or polishing techniques now known or later developed, including lift-off, etching and chemical mechanical polishing techniques.

After the block out mask is removed, the barrier layer 261 is deposited in both the crack stop structure recess 255 and the interconnect recess 257. In the crack stop recess, the barrier layer 261 is deposited over the high modulus layer 234. In preferred embodiments of the invention, a barrier or liner layer 261 is selected according to the preferred interconnect structure. Typical barrier layers include materials from the group of Ta, Ti, W, their nitrides or a combination thereof. In embodiments of the invention, the barrier layer 261 is deposited utilizing a conventional (or developed in the future) deposition process including, for example, chemical vapor deposition (CVD), plasma enhanced chemical vapor deposition (PECVD), physical vapor deposition (PVD) or sputtering. The thickness of the layer 261 can vary according to the type of layer being formed and the technique used in forming the same. Typically, the barrier layer 261 has a thickness from 1 nm to 100 nm with a thickness from 2 nm to 50 nm being more typical. Within the metal interconnect, the liner material 261 prevents the diffusion of the subsequent metal layer into the dielectric 213. Ideally, the characteristics are selected so that it may also act as an adhesion promoting layer so that the layers of the structure are bonded together.

Figure 7:
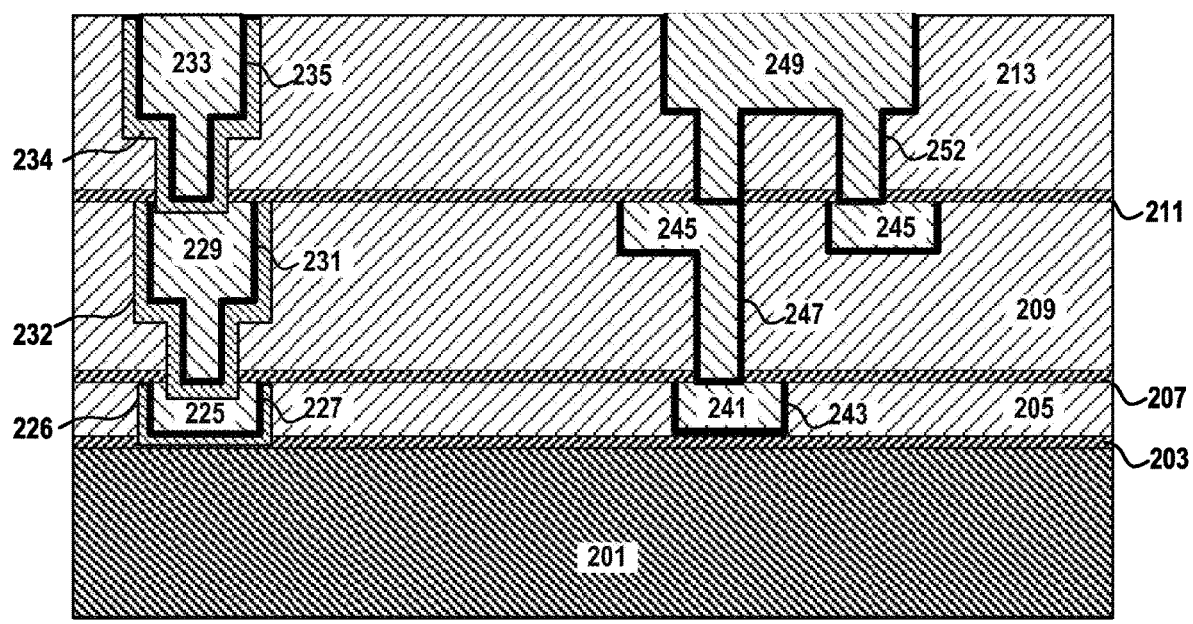
FIG. 7 is a cross-sectional diagram depicting the depicting the crack stop structure together with a simplified metal interconnect structure after the contact metallurgy has been formed according to a first embodiment of the invention.

FIG. 7 is a cross-sectional diagram depicting the crack stop structure together with a simplified metal interconnect structure after the contact metallurgy has been formed according to a first embodiment of the invention. This drawing represents the structure after two process steps, a metal deposition step and a planarization step.

While many alternative metals and metal alloys can be used in the interconnecting metallurgy, a typical metal used in a first embodiment of the invention is copper or a copper alloy. A copper deposition step has can be utilizing a conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the copper layer can vary depending on the depth of the trench and the technique used in forming the copper layer. Typically, the copper layer has an overburden thickness from 100 nm to 1000 nm, with a thickness from 300 nm to 800 nm being more typical.

The metal deposition step is followed by a planarization process such as a chemical mechanical polishing (CMP) step according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions (in the field areas) of the high modulus layer 234, the barrier/liner layer 261 (forming respective barrier layers 235, 252 in the crack stop and interconnect structures) and the metal layer (forming respective metal structures 233, 249 in the crack stop and interconnect structures). The field areas of the dielectric layer 213 are those areas outside the etched features of the pattern in the dielectric. Other planarization processes are known to the art and are used in alternative embodiments of the invention.

As is known to the art, the metallization layer is followed by additional processing to fabricate contacts for structures which attach the chip to a packaging substrate so that the chip can be incorporated into a computing device. After completing the integrated circuits in the wafer, the wafer is diced and the individual chips are placed on their respective substrates.

In embodiments of the invention, a high modulus liner is incorporated within a crack stop structure. While the crack stop structure shares many of the same layers of the accompanying interconnecting metallurgy, the high modulus liner is not in the interconnects, but only, at least as a separate layer, within the crack stop structure. In embodiments of the invention, the high modulus liner is an insulator, such as SiN, SiC, or SiO2 or combination of the same. In other embodiments, the high modulus liner is a metallic material, such as W, Ta, Ti, Ru, Rh, Co and/or their nitrides, oxides and alloys. In those embodiments in which the high modulus layer is a metallic material, it is usually a different metal than that used as the main conductor of the interconnect structure. In the embodiment above, the high modulus liner is a single material layer, however, in other embodiments, the high modulus liner contains multiple material layers. Embodiments of the invention use multiple layers to tailor the physical characteristics of the high modulus layer as well as to provide better process windows and engineering control. Depending on the metal interconnect structure which the crack stop structure is designed to protect, the high modulus liner has a thickness range between 5 Angstroms and 100 nm.

Figure 8:
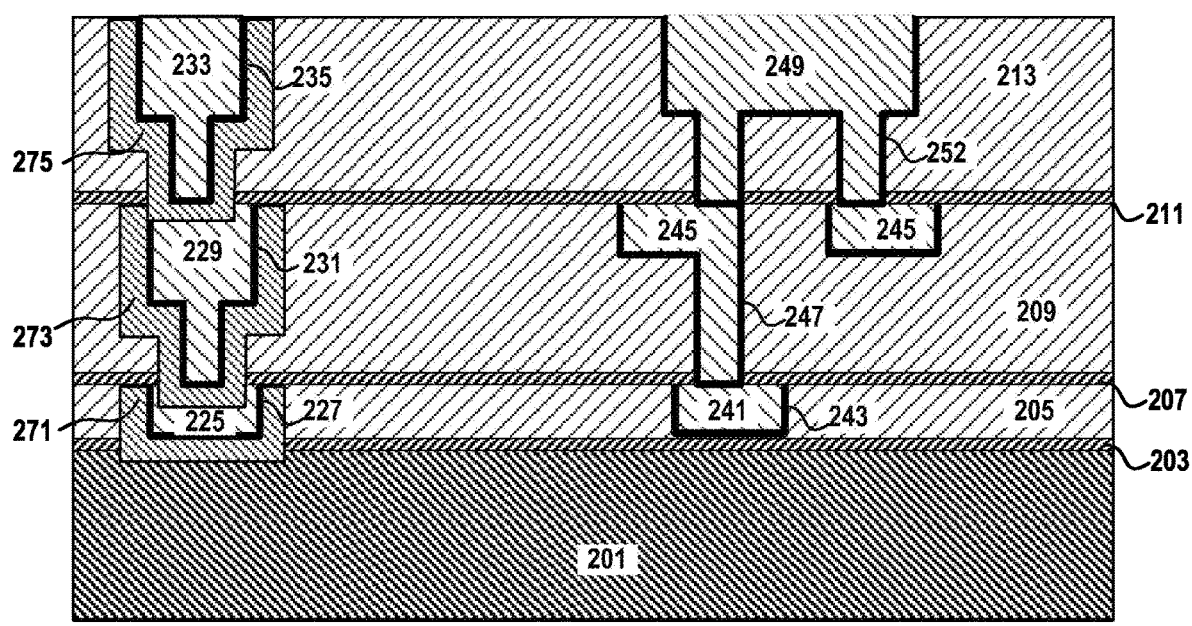
FIG. 8 is a cross-sectional diagram depicting a crack stop structure together with a simplified metal interconnect structure according to a second embodiment of the invention.

FIG. 8 is a cross-sectional diagram depicting a crack stop structure together with a simplified metal interconnect structure according to a second embodiment of the invention. As compared to the first embodiment, each level of the crack stop structure has a relatively thicker layer of the high modulus material 271, 273 and 275. As recognized by the inventors, the crack stop structure need not be electrically functional, so in those embodiments in which a dielectric material is used as the high modulus layer, a greater relative amount of dielectric can be used as compared to the interconnect structure it protects. Given a range of 1 nm to 400 nm in thickness of the high modulus layer for the first embodiment, in the second embodiment, the thickness of the high modulus layer could range from 3 nm to 100 nm in thickness.

In embodiments of the invention, such as the first embodiment discussed above, the thickness of the high modulus material layer is comparable to the barrier layer thickness. In other embodiments, such as the second embodiment, the thickness of the high modulus material is at least twice of the barrier layer. Given the properties of the low-k material, e.g., if the low-k is more porous, and therefore, has a weaker mechanical property, thicker layers of the high modulus layer may be required to protect the interconnect region. In the second embodiment, a single layer or multiple layers of the same or different materials are used in the thicker high modulus layer in different variations of the second embodiment.

Figure 9:
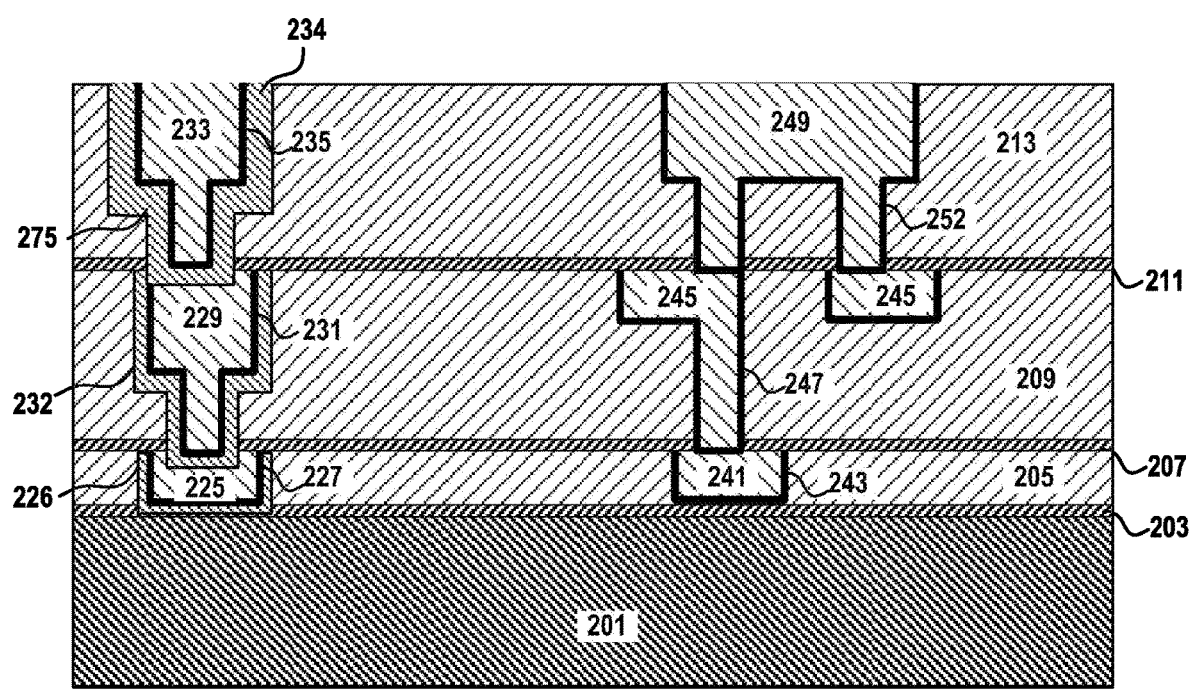
FIG. 9 is a cross-sectional diagram depicting a crack stop structure together with a simplified metal interconnect structure after an etch step has been performed on a top insulator layer according to a third embodiment of the invention.

FIG. 9 is a cross-sectional diagram depicting a crack stop structure together with a simplified metal interconnect structure after an etch step has been performed on a top insulator layer according to a third embodiment of the invention. In this drawing, a thicker high modulus layer 275 in the top level is shown relative to the high modulus layers 226, 232 in other levels. This drawing is used to illustrate that the thickness of the high modulus layers can be different in different levels to accommodate process differences in each of the levels. Further, a better mechanical property on the top level from a thicker high modulus layer is desirable in some embodiments to offset the greater forces at the top level due to the dicing process. In addition to thicker layers of the high modulus material in respective levels of the crack stop structure, different materials can be used for the high modulus layers in respective levels of the crack stop structure. Different dielectrics could be used in different levels and the high modulus materials can be adjusted accordingly. In variations of the third embodiment, some or all of the levels of the crack stop structure will have their own selected high modulus material and their own thickness, that is, more than one level will vary from any other level of the crack stop structure.

FIGS. 10-14 depict a process for fabricating a fourth embodiment of the invention wherein the high modulus layer is used to fill the entire crack stop recess in a respective level.

Figure 10:
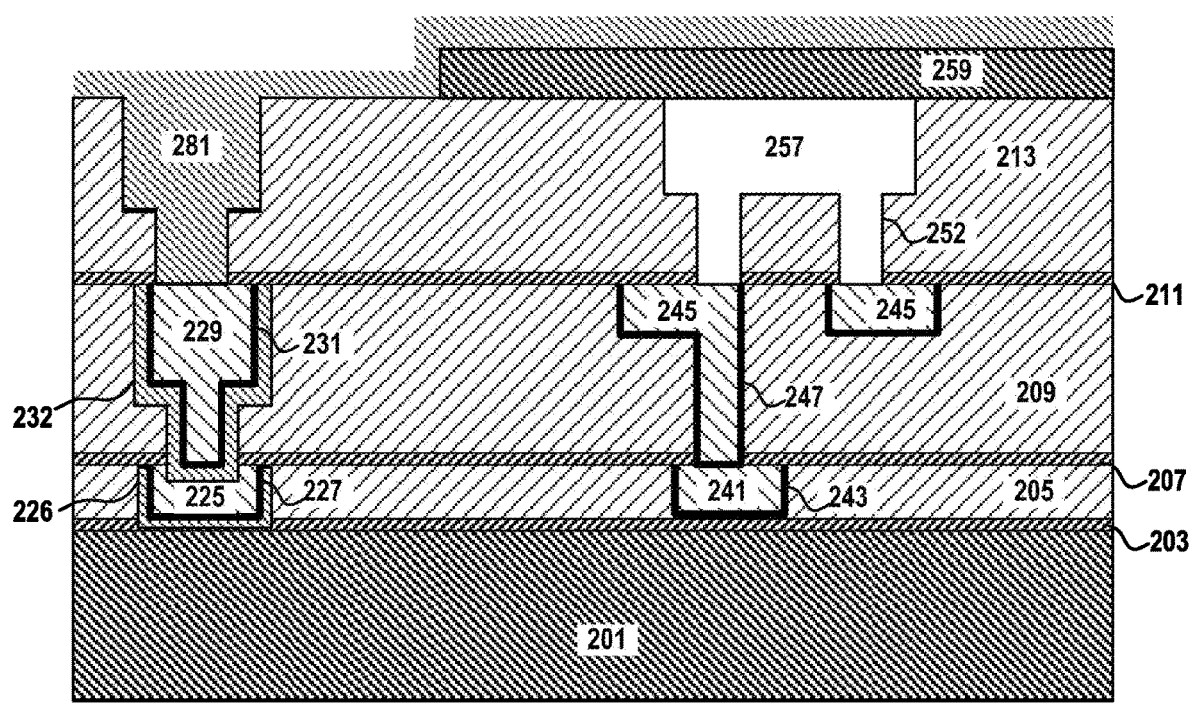
FIG. 10 is a cross-sectional diagram depicting the crack stop structure together with a simplified metal interconnect structure after a block out mask deposition and high modulus material deposition steps have been performed according to a fourth embodiment of the invention.

FIG. 10 is a cross-sectional diagram depicting the crack stop structure together with a simplified metal interconnect structure after block out mask deposition and high modulus material deposition steps have been performed according to a fourth embodiment of the invention. This drawing represents a similar point in the process as FIG. 5 above, however, in this embodiment, the high modulus layer 281 fills the entire crack stop recess.

The block out mask 259 prevents deposition of the high modulus layer in the recess 257 for the interconnect structure. As in the embodiments above, the high modulus layer 281 may be comprised of a single layer or could be a plurality of layers. There are variations of this embodiment where the high modulus layer completely fills the entire recess as shown. In other variations, there is a center void in the high modulus layer. The high modulus materials previously discussed in reference to other embodiments can be used in this embodiment. Different deposition technologies are used in respective embodiments. For example, a chemical vapor deposition (CVD) process such as a low pressure chemical vapor deposition (LPCVD) or a plasma enhanced chemical vapor deposition (PECVD) process are used in some embodiments.

Figure 11:
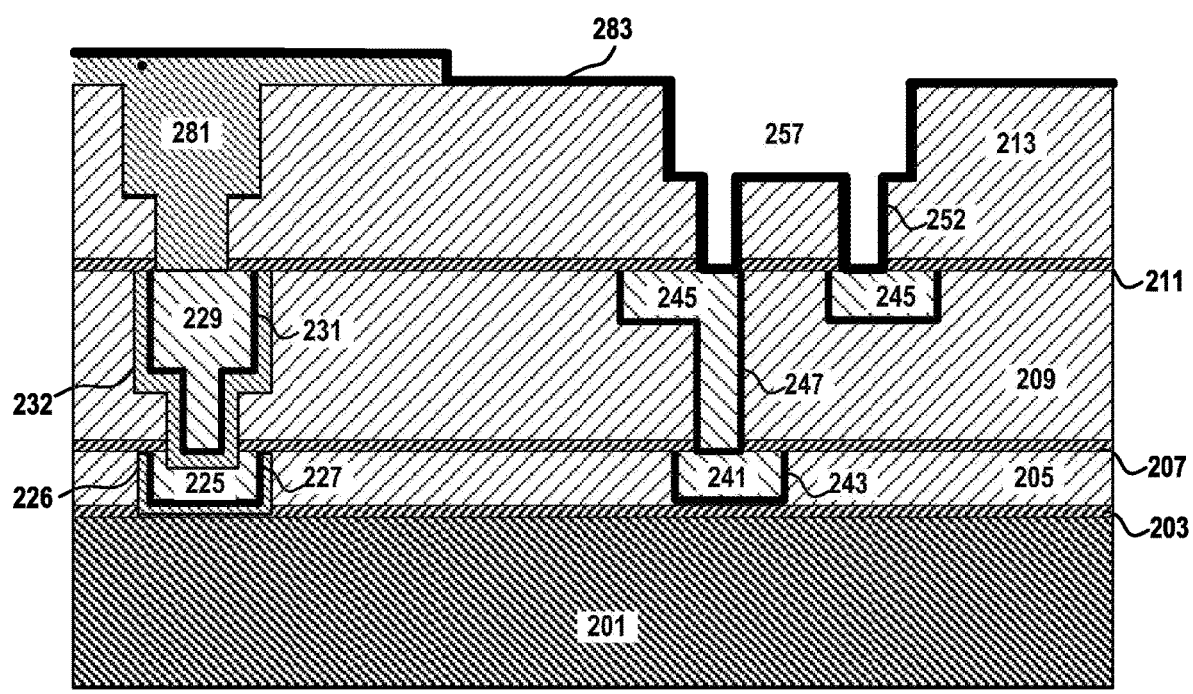
FIG. 11 is a cross-sectional diagram depicting the crack stop structure together with a simplified metal interconnect structure after a barrier layer has been formed according to a fourth embodiment of the invention.

FIG. 11 is a cross-sectional diagram depicting the crack stop structure together with a simplified metal interconnect structure after a barrier layer has been formed according to a fourth embodiment of the invention. The block out mask has been removed using an appropriate removal technology depending on its composition as discussed above. Next, a barrier/liner layer 283 is deposited. Because the entire crack stop recess has been filled with the high modulus layer 281, the barrier layer 283 is only deposited in the interconnect recess 257.

Figure 12:
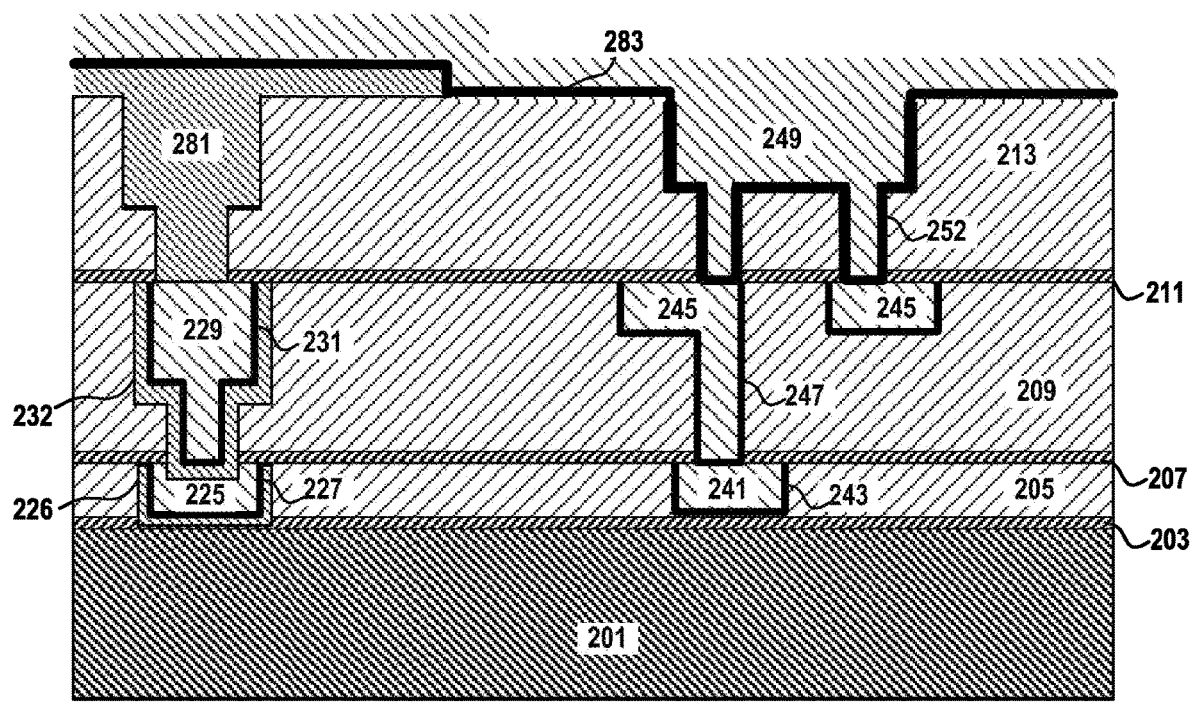
FIG. 12 is a cross-sectional diagram depicting the depicting the crack stop structure together with a simplified metal interconnect structure after the contact metallurgy has been formed according to a fourth embodiment of the invention.

FIG. 12 is a cross-sectional diagram depicting the depicting the crack stop structure together with a simplified metal interconnect structure after the contact metallurgy has been formed according to a fourth embodiment of the invention. Because the entire crack stop recess has been filled with the high modulus layer 281, the metal layer 249 is only deposited in the volume of the interconnect recess which is not already occupied by the barrier layer 283.

Figure 13:
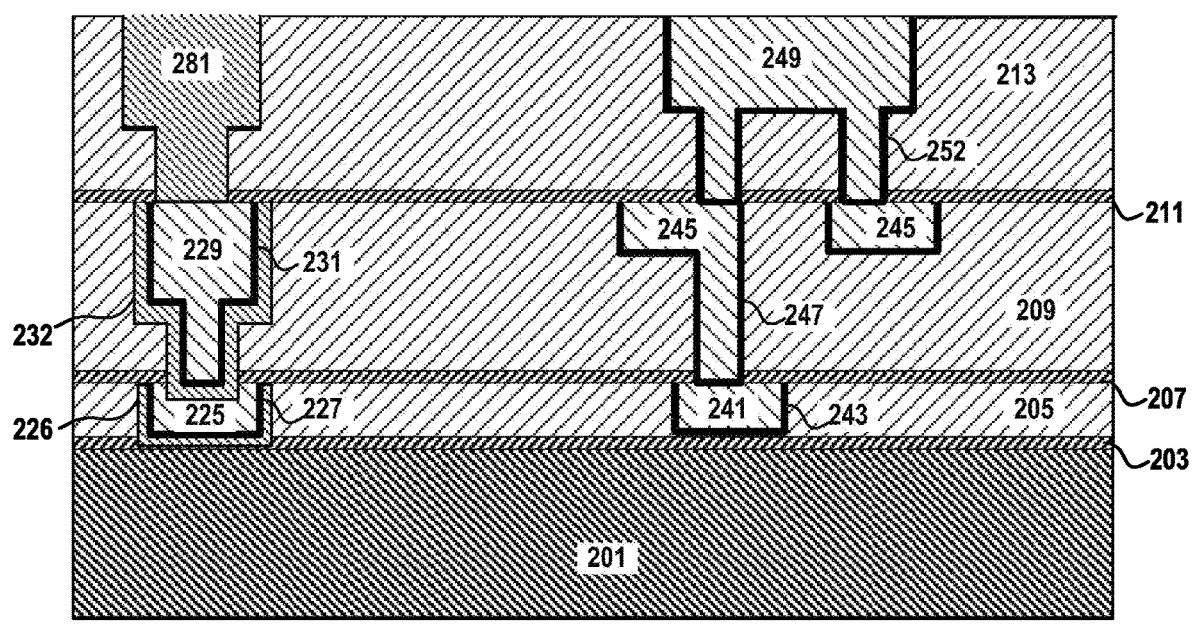
FIG. 13 is a cross-sectional diagram depicting the depicting the crack stop structure together with a simplified metal interconnect structure after a planarization step has been performed according to a fourth embodiment of the invention.

FIG. 13 is a cross-sectional diagram depicting the depicting the crack stop structure together with a simplified metal interconnect structure after a planarization step has been performed according to the fourth embodiment of the invention. In variations of the fourth embodiment, more than one or all of the levels of the crack stop structure will be fully filled by the high modulus layer.

Although the figures show only three levels for ease in illustration, in an actual device there can be more levels of the interconnection structure and hence in the crack stop structure. Further, although the drawings show the third, upper level as differing and having a thicker high modulus layer as compared to the lower levels, each of the levels may have a respective thickness of the high modulus layer. For example, the lower level of the crack stop structure may have a thicker high modulus layer if the low-k dielectric of the lowel device level was especially brittle, or if the dimensions of the interconnection wiring was especially small. Lower k (and lower, weaker modulus) dielectric materials are often in lower levels of the interconnect structure.

In embodiments of the invention, the high modulus liner is added to the crack stop structure, but not to the interconnection structures of the active device. In many of the embodiments, some of the materials and processes are shared between the crack stop and interconnection structures at least on some of the levels. Traditional high modulus dielectric materials such as silicon dioxide, or metallic materials or even esoteric materials which have good mechanical, but poor electrical properties could be used. Esoteric materials not normally used in semiconductor processing such as vanadium oxide can be used as the high modulus material in the crack stop structure. The physical properties of vanadium oxide and similar materials change with temperature. Deposition techniques such as PVD, CVD, ALD, spin-on deposition can be used to deposit these materials.

Where the high modulus layer is an insulator, the conductive metal portions of the crack stop are not continuous from the top of the metallization to the bottom as is the case in the interconnection structure and in the prior art crack stop structure.

In embodiments of the invention, the high modulus liner thickness and material used varies on respective levels of the crack stop structure. The variation between the different levels can be tuned according to the particular low-k material used on that level of the chip where different low-k materials are used on different levels of the chip. For example, a thicker high modulus liner would be used on levels of the chip which have a very low modulus. Alternatively, the overall mechanical characteristics of the crack stop can be adjusted by changing the high modulus layer in respective levels. In this way, the thickness of the high modulus liner can be tuned to the characteristics of the respective chip level. In some embodiments, one of the levels of the chip could use a high modulus dielectric for the entire crack stop layer in which case no high modulus barrier liner would be needed.

In yet other embodiments, the high modulus liner is made up of multiple material layers. This embodiment also would lend itself to tuning the layers or number of layers of the high modulus liner according to the modulus of the dielectric in the particular level. Multiple layers can be selected for their mechanical properties, e.g., adhesion with other materials in the crack stop structure or the dielectric.

In yet other embodiments, not all of the crack stop levels have a high modulus layer. As mentioned above, the dielectric layers which make up the interconnect structure and the crack stop structure may be different; some of the dielectric layers could be low-k porous dielectric layers and other layers could be high modulus dielectric layers. Where the ILD itself is a high modulus material, the respective crack stop structure level may lack the high modulus layer in interests of process simplification. In this case, the crack stop structure would have some levels with a high modulus layer and some levels without a high modulus layer which would mirror those of the interconnect structure on that level.

In some embodiments, the brittle, low-k dielectric is at a lower level of the interconnect structure because of the product design. Products operating at higher temperature are sensitive to this layouts because of more thermal expansion related impacts. In these embodiments, a more robust, e.g., thicker, high modulus layer could be used in the lower level. In this way, the high modulus layer is tailored or matched to the dielectric used in the level.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for creating an integrated circuit (IC) structure comprising:

forming an interconnection structure comprised of a plurality of levels, having an interconnect structure section and a crack stop section;

in a first level of the interconnection structure, providing an interconnection recess and a crack stop recess, and forming a high modulus layer in the crack stop recess but not the interconnect recess;

forming a barrier layer and a conductive metal layer in both the interconnection recess and the crack stop recess of the first level;

in a second level of the interconnection structure and the crack stop structure, providing an interconnection recess and a crack stop recess, and forming a second high modulus layer in the crack stop recess but not the interconnect recess; and forming a barrier layer and a conductive metal layer in both the interconnection recess and the crack stop recess of the second level;

wherein the barrier layers and high modulus layers are deposited in different steps.

2. The method as recited in claim 1, further comprising depositing the barrier layer on the high modulus layer in the crack stop recess of the first level.

3. The method as recited in claim 2, further comprising depositing the conductive metal layer on the barrier layer in the crack stop recess of the first level.

4. The method as recited in claim 1, wherein a dielectric high modulus layer is formed in the crack stop recess of the first level of the crack stop structure.

5. The method as recited in claim 1, wherein the crack stop structure in a third level lacks a high modulus layer and is built like the interconnect structure in the third level and the third level has a high modulus ILD.

6. The method as recited in claim 1, wherein the high modulus layer in the first level is different that the high modulus layer in the second level, and each high modulus layer is selected according to the ILD in the level.

7. The method as recited in claim 6, wherein the high modulus layer in the first level has a higher thickness than the high modulus layer in the second level.

8. The method as recited in claim 6, wherein the high modulus layer in the first level is a first high modulus material and the high modulus layer in the second level is a second high modulus material.

9. The method as recited in claim 1, wherein the high modulus layer in the first level is comprised of a plurality of high modulus materials.

10. The method as recited in claim 1, wherein the high modulus layer in the first level has a void.

11. A method for creating an integrated circuit (IC) structure comprising:
    forming an interconnection structure comprised of a plurality of levels, having an interconnect structure section and a crack stop section;
    in a first set of levels of the interconnection structure, forming an interconnection recess and a crack stop recess, and forming a high modulus layer in the crack stop recess but not the interconnect recess;
    forming a barrier layer and a conductive metal layer in both the interconnection recess and the crack stop recess of the first set of levels;
    in a second set of levels of the interconnection structure and the crack stop structure, providing an interconnection recess and a crack stop recess, and forming a second high modulus layer in the crack stop recess but not in the interconnect recess; and
    forming a barrier layer and a conductive metal layer in both the interconnection recess and the crack stop recess of the second set of levels;
    wherein the barrier layers and high modulus layers are deposited in different steps.

12. The method as recited in claim 11, further comprising depositing the barrier layer on the high modulus layer in the crack stop recess of the first set of levels.

13. The method as recited in claim 12, further comprising depositing the conductive metal layer on the barrier layer in the crack stop recess of the first set of levels.

14. The method as recited in claim 11, wherein a dielectric high modulus layer is formed in each crack stop recess of the first set of levels of the crack stop structure.

15. The method as recited in claim 11, wherein the crack stop structure levels lacks a high modulus layer in a third set of levels and is built like the interconnect structure in the third set of levels and the third set of levels has a high modulus ILD.

16. The method as recited in claim 11, wherein the high modulus layers in respective levels of the second set of levels is different that the high modulus layers in the first set of levels, and each high modulus layer is selected according to the ILD in the respective level.

17. The method as recited in claim 16, wherein the high modulus layer in the first set of levels has a higher thickness than the high modulus layer in the second set of levels.

18. The method as recited in claim 16, wherein the high modulus layer in the first set of levels is a first high modulus material and the high modulus layer in the second set of levels is a second high modulus material.

19. The method as recited in claim 11, wherein the high modulus layer in the first level is comprised of a plurality of high modulus materials.

20. The method as recited in claim 11, wherein the high modulus layer in the first set of levels has a void.

* * * * *